United States Patent [19]

Roemer et al.

[11] Patent Number: 4,794,338

[45] Date of Patent: Dec. 27, 1988

[54] BALANCED SELF-SHIELDED GRADIENT COILS

[75] Inventors: Peter B. Roemer, Schenectady, N.Y.; Kenneth M. Bradshaw, Idaho Falls, Id.

[73] Assignee: General Electric Company, Milwaukee, Wis.

[21] Appl. No.: 125,659

[22] Filed: Nov. 25, 1987

[51] Int. Cl.⁴ .......................................... G01R 33/20
[52] U.S. Cl. .................... 324/39; 336/84 C; 336/232; 324/318; 335/299; 335/301
[58] Field of Search ............ 335/299, 216, 219, 301; 224/318, 319, 320; 336/84 C, 220, 232, 225

[56] References Cited

U.S. PATENT DOCUMENTS

| | | | |
|---|---|---|---|
| 3,474,295 | 10/1969 | Marshall | 324/319 |
| 4,320,342 | 3/1982 | Heinzerling | 324/319 |
| 4,617,516 | 10/1986 | Shenck | 324/318 |
| 4,646,024 | 2/1987 | Shenck et al. | 324/318 |
| 4,680,666 | 7/1987 | Rios | 361/141 |
| 4,724,412 | 2/1988 | Kalafala | 335/299 |
| 4,733,189 | 3/1988 | Punchard et al. | 324/318 |
| 4,737,716 | 4/1988 | Roemer et al. | 324/319 |

*Primary Examiner*—John Chapman
*Assistant Examiner*—Lawrence G. Fess
*Attorney, Agent, or Firm*—Mark L. Mollon; Douglas E. Stoner

[57] ABSTRACT

Self-shielded gradient coils are used to eliminate interactions between gradient coils and external structure. Interactions between gradient coils for different gradient axes are controlled by means of a balanced interconnection within each separate gradient coil set. One or both of the inner and outer coils within a gradient coil set are split such that for any localized capacitive current flow between coil sets there will be an equal and opposite current flow somewhere else between the coil sets.

8 Claims, 2 Drawing Sheets

U.S. Patent    Dec. 27, 1988    Sheet 1 of 2    4,794,338
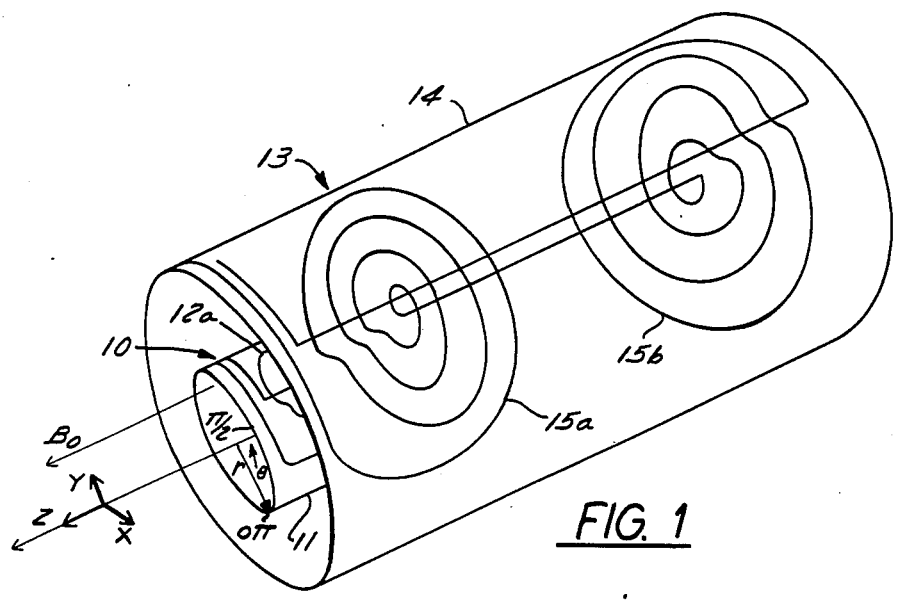
FIG. 1
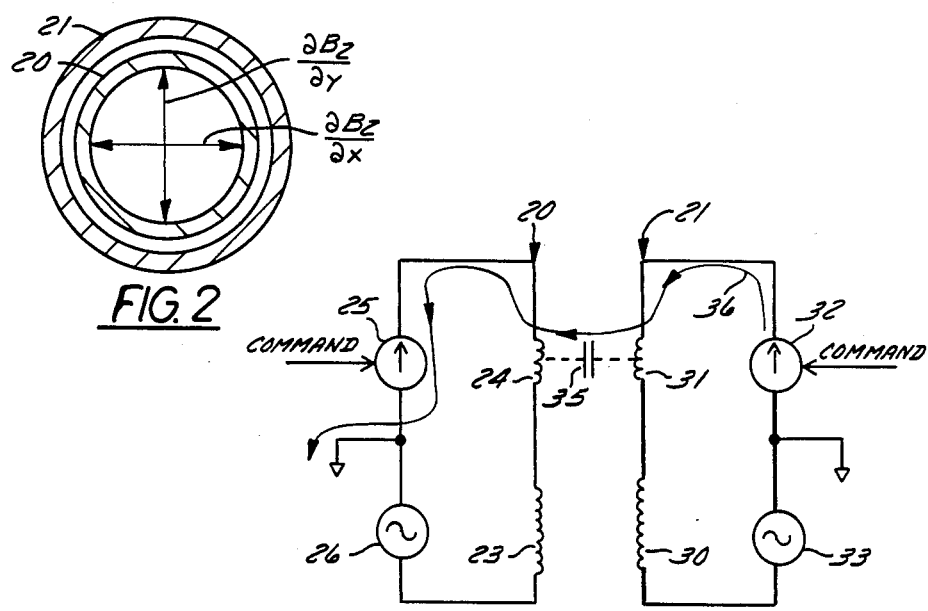
FIG. 2
FIG. 3
PRIOR ART

4,794,338

BALANCED SELF-SHIELDED GRADIENT COILS

BACKGROUND OF THE INVENTION

The present invention relates in general to coils useful in nuclear magnetic resonance (NMR) apparatus, and more specifically to a balanced configuration for shelf-shielded gradient coils.

Magnetic Resonance Imaging (MRI) systems are currently employed in forming tomographic images of the internal human anatomy. In such systems, a patient is placed in a static magnetic field and is subjected to radio-frequency electromagnetic pulses to excite nuclear spins. The magnetic resonance of the atomic nuclei of the patient is detected with a receiving coil to provide information from which an image of that portion of the patient containing these nuclei may be formed. The magentic field possesses gradients which are pulsed on during each detection sequence so that the position of resonating nuclei can be determined. These same phenomena are employed in magnetic resonance spectroscopy for analyzing properties and structures of substances.

A shielded type of gradient coil is known from U.S. patent application Ser. No. 826,650, now U.S. Pat. No. 4,737,716, filed Feb. 6, 1986, which is hereby incorporated by reference. A shielded gradient coil is desired to reduce various interactions of the gradient fields with other structure such as the main field magnet. The interactions include field spatial and temporal distortions, energy dissipation and annoying audible sound.

In the preferred embodiment of the previous invention, concentric inner and outer coils are employed for each gradient axis. The inner and outer coils for each axis are connected in series. The surface current distributions of each coil set result in a gradient magnetic field inside the coil set and a substantially zero field outside the coil set.

Typical MRI systems employ gradient magnetic fields along three orthogonal axes in the x, y and z directions. The z-axis is usually defined as coinciding with the direction of the main static magnetic field (which is usually along the axis of the main cylindrical magnet) and the x- and y-axes are perpendicular to the static field. The gradient coil set for each axis has its own respective gradient amplifier which is under control of the imaging system.

The coil sets must be operated in close proximity to each other. However, it has been found that problems can occur during pulsed operations of the gradient coils resulting from interactions between separate coil sets. For example, the gradient amplifiers may become unstable.

Accordingly, it is a principal object of the present invention to improve the operation of gradient apparatus in MRI systems.

It is another object to reduce or compensate for interactions between coil sets in close proximity.

It is yet another object of the invention to avoid unstable operation of gradient amplifiers used in conjunction with self-shielded gradient coils.

SUMMARY OF THE INVENTION

These and other objects are achieved in a coil set for producing a magnetic field in a magnetic resonance apparatus which comprises an inner coil, an outer coil and particular interconnect means between the outer and inner coils. Further coil sets can be provided for other gradient axes.

In particular, the outer coil is coaxially disposed from the inner coil. The co-action of the inner and outer coils provides a predetermined magnetic field within the coil set and a substantially zero magnetic field outside the coil set. The interconnect means provides an electrical interconnection between the inner and outer coils such that energizing current for the coil set flows through a portion of one of the inner and outer coils, through at least a portion of the other coil and then through a further portion of the one coil. In this way, the impedance of the coil set is symmetrically balanced and interactions can be avoided.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings in which:

FIG. 1 is a perspective view of a self-sheilded gradient coil pair.

FIG. 2 is an end view of two coil sets for producing two orthogonal gradient fields.

FIG. 3 is a schematic diagram of a prior-art interconnect scheme.

DETAILED DESCRIPTION OF THE INVENTION

Figure 4:
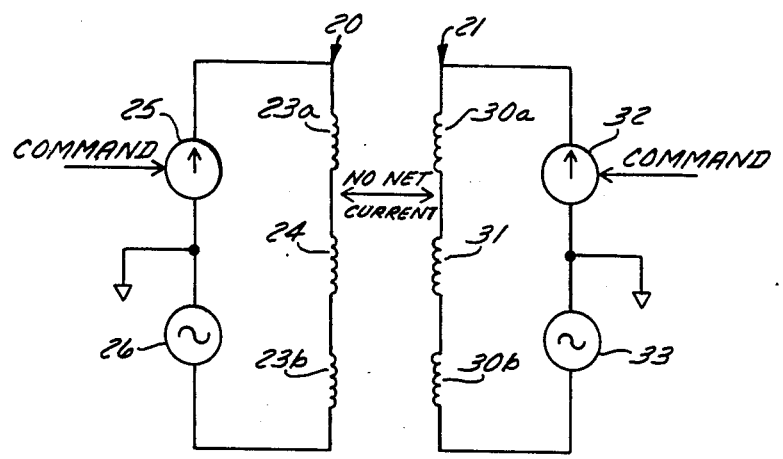
FIG. 4 is a schematic of an interconnect scheme according to the present invention.

Referring now to FIG. 1, a pair of coils includes an inner coil 10 and a concentric outer coil 13, each of which is cylindrical and aligned with the z-axis. The coil set is arranged longitudinally with respect to the main static field $B_0$ in order to provide a gradient magnetic field in an imaging volume within its interior.

Inner coil 10 comprises a cylindrical substrate 11 carrying gradient windings, a portion of which is seen as 12a. Likewise, outer coil 13 comprises a substrate 14 and gradient windings including 15a and 15b. The substrates may typically be formed of a flexible printed circuit board material, and the windings may typically be etched conductors that may be on one or both sides of the circuit board and are covered with an insulating material. The windings on each circuit board resemble four fingerprints (i.e. spiral) interconnected to provide orthogonal gradient fields (see also FIG. 5). Each spatial location on the coils can be specified by its x, y and z coordinates or by cylindrical coordinates z, r and $\theta$ as shown in FIG. 1.

FIG. 2 shows an x-gradient coil set 20 for providing the x-gradient $\partial B_z/\partial x$ and a concentric y-gradient coil set 21 for providing the y-gradient $\partial B_z/\partial y$. Each coil set is connected to a separate power supply so that the separate gradients can be pulsed independently. For example, in the conventional spin warp imaging pulse sequence, the y-gradient may be pulsed during a spatial encoding step and then the x-gradient may be pulsed later during an NMR signal readout step. It is also common for the x- and y-gradients to be pulsed simultaneously.

FIG. 3 shows a typical power supply connection for the coil sets of FIG. 2. The x-gradient set 20 includes an inner coil 23 and outer coil 24 connected in series with an x-gradient master amplifier 25 and an x-gradient slave amplifier 26. Likewise, y-gradient coil set 21 includes an inner coil 30 and an outer coil 31 connected in series with a y-gradient master amplifier 32 and a y-gradient slave amplifier 33. The junction between each pair of amplifiers is connected to ground.

Master amplifiers 25 and 32 receive respective current commands from an NMR system (not shown). In order to ensure that the commanded current actually flows to the gradient coils, master amplifiers 25 and 32 employ closed-loop feedback control using a current sensor, such as a current-sense resistor. Slave amplifiers 26 and 33 directly follow their respective master amplifier, but are controlled open-loop by the master. Each slave amplifier provides voltage in the opposite direction to its master. Thus, the amplifiers are stacked current-wise resulting in a desirably increased rail voltage.

Because of the large amount of conductor area used to form each coil set and because of the close proximity between coil sets, a large amount of capacitance results between coil sets. This capacitance is shown as an inherent capacitance 35 in FIG. 3. A low impedance path 36 including capacitance 35 from one coil set to another can cause instabilities of the gradient amplifiers during gradient pulsing or other problems.

By design, each outer coil 24 and 31 links no net flux (this is required for good shielding). Thus, each outer coil is essentially at constant potential even during a current pulse except for a small resistive voltage drop. If an outer coil is connected to one side of the master-slave amplifier combination, it will rise to the full potential of that side of the amplifier when pulsed (almost all the voltage drops across the inner coil). Consequently, a capacitive current flows from the pulsed outer coil to the windings of the other coil set and through the master or slave amplifier of the other coil set to ground. This current is sensed by the master amplifiers of both gradient axes which leads to the instability between amplifiers, each trying to correct the current excited by the other.

Ideally, no uncommanded current should flow through master amplifiers 25 or 32 since they operate with current feedback. However, a typical amplifier cannot prevent the capacitive current flow. Thus, the current can flow through both master and slave (i.e., path 36 is just one of several possible paths).

To eliminate the problems associated with interactions between coil sets, the present invention substantially removes capacitive current flow by connecting the gradient coils as shown in FIG. 4. In the x-gradient coil set, inner coil 23 is split into two halves 23a and 23b. Outer coil 24 is connected between inner coil halves 23a and 23b. Other split configurations of either or both coils are also possible so long as the configuration is electrically symmetrical such that when the coil set receives an applied voltage from the gradient amplifier, every point on each coil of the set has a corresponding unique point on the same coil with equal and opposite potential. Thus, no net current will flow between separate gradient axes since for any localized current there will be an equal and opposite current somewhere else between coil sets.

Although one can split either the inner or outer gradient coils, or both, it is preferred to split inner coils 23 and 30 as shown in FIG. 4. There is usually a greater amount of space for added connections on the inner coil since the outer coil is usually located very close to other structures such as the shimming coils. Also, the outer coil is larger and has more capacitance, so that having the entire outer coil at or near zero potential (due to the split power supply amplifier configuration) gives less overall localized current flow.

Figure 5:
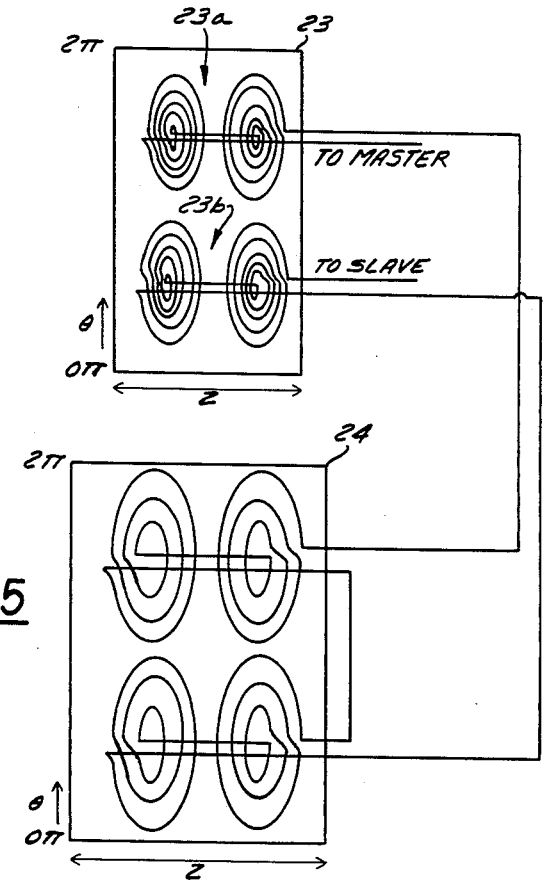
FIG. 5 is a wiring diagram for the inner and outer coils in a preferred embodiment.

FIG. 5 shows the winding configuration for the embodiment of FIG. 4 in more detail. Thus, a series path is provided from the master amplifier, through one-half (two fingerprints) of inner coil 23, through all of outer coil 24, through the second half of inner coil 23 and to the slave amplifier. Thus, a symmetrically balanced coil set is provided which reduces or eliminates interactions between coil sets and which avoids gradient amplifier instabilities.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. A coil set for producing a magnetic field in a magnetic resonance apparatus, comprising:
    an inner coil;
    an outer coil coaxially disposed from said inner coil, said inner and outer coils adapted to provide a predetermined magnetic field within said inner coil and a substantially zero magnetic field outside said outer coil; and
    interconnect means for electrically interconnecting said inner and outer coils such that energizing current for said coil set flows in series through a portion of one of said inner and outer coils, through at least a portion of the other of said inner and outer coils, and then through a further portion of said one coil, so that the localized potential impedance of said coil set are symmetrically balanced.

2. The coil set of claim 1 wherein each of said inner and outer coils is comprised of conductors etched on a circuit board, said conductors being in the shape of a plurality of fingerprints.

3. The coil set of claim 1 wherein said predetermined magnetic field possesses a linear gradient along a predetermined direction.

4. Apparatus for producing orthogonal gradient magnetic fields in a magnetic resonance apparatus, comprising:
    a first coil set for providing a first gradient field, including a first inner coil and a first outer coil interconnected so that energizing current for said first coil set flows in series through a portion of one of said coils, through at least a portion of the other of said coils, and then through a further portion of said one coil;
    a second coil set coaxially disposed from said first coil set for providing a second gradient field orthogonal with said first gradient field, said second coil set including a second inner coil and a second outer coil interconnected so that energizing current for said second coil set flows in series through a portion of one of said coils, through at least a portion of the other of said coils, and then through a further portion of said one coil;

whereby capacitively-coupled localized currents cancel so that no net current flows between said first coil set and said second coil set.

5. The apparatus of claim 4 wherein each of said inner and outer coils is comprised of conductors etched on a circuit board, said conductors formed in the shape of a plurality of fingerprints.

6. The apparatus of claim 4 further comprising first and second amplifiers connected to said first and second coil sets, respectively, for providing said energizing currents.

7. The apparatus of claim 6 wherein said first and second amplifiers are comprised of master-slave amplifiers.

8. A method for providing stable operation of gradient amplifiers connected to self-shielded gradient coil sets in nuclear magnetic resonance apparatus, comprising the steps of:

interconnecting an inner and an outer coil for each of said coil sets so that energizing current flows in series through a portion of one of said coils, through at least a portion of the other of said coils, and then through a further portion of said one coil; and energizing said gradient amplifiers to induce gradient magnetic fields by current flow in said coil sets.

* * * * *

UNITED STATES PATENT AND TRADEMARK OFFICE
CERTIFICATE OF CORRECTION

PATENT NO. : 4,794,338

DATED : Dec. 27, 1988

INVENTOR(S) : Peter B. Roemer and Kenneth M. Bradshaw

It is certified that error appears in the above-identified patent and that said Letters Patent is hereby corrected as shown below:

Col. 1, line 7 change "shelf-" to --self-"

Col. 4, line 41, delete "potential impedance" and substitute therefor --potentials--.

Signed and Sealed this

Twenty-seventh Day of November, 1990

Attest:

HARRY F. MANBECK, JR.

Attesting Officer

Commissioner of Patents and Trademarks